(12) United States Patent
Zhang et al.

(10) Patent No.: US 11,742,807 B1
(45) Date of Patent: Aug. 29, 2023

(54) DUAL-BAND COUPLING LOW-NOISE AMPLIFYING CIRCUIT AND AMPLIFIER

(71) Applicant: GUANGDONG UNIVERSITY OF TECHNOLOGY, Guangzhou (CN)

(72) Inventors: Zhihao Zhang, Guangzhou (CN); Jinfeng Chen, Guangzhou (CN); Xinlei Yang, Guangzhou (CN); Guohao Zhang, Guangzhou (CN)

(73) Assignee: GUANGDONG UNIVERSITY OF TECHNOLOGY, Guangzhou (CN)

(*) Notice: Subject to any disclaimer, the term of this patent is extended or adjusted under 35 U.S.C. 154(b) by 0 days.

(21) Appl. No.: 18/109,382

(22) Filed: Feb. 14, 2023

(51) Int. Cl.
| | |
|---|---|
| *H03F 1/07* | (2006.01) |
| *H03F 3/193* | (2006.01) |
| *H03F 3/24* | (2006.01) |
| *H03F 1/02* | (2006.01) |
| *H03F 1/26* | (2006.01) |

(52) U.S. Cl.
CPC ......... *H03F 3/1935* (2013.01); *H03F 1/0277* (2013.01); *H03F 1/26* (2013.01); *H03F 3/245* (2013.01); *H03F 2200/294* (2013.01); *H03F 2200/451* (2013.01)

(58) Field of Classification Search
CPC .................................... H03F 1/07; H03F 1/02
USPC ............................................. 330/295, 124 R
See application file for complete search history.

(56) References Cited

U.S. PATENT DOCUMENTS

| | | | | |
|---|---|---|---|---|
| 6,085,074 A * | 7/2000 | Cygan | ................... | H03F 1/0288 333/100 |
| 6,515,544 B1 * | 2/2003 | Suzuki | ................... | H03F 3/602 330/149 |
| 6,954,623 B2 * | 10/2005 | Chang | ................... | H03F 3/602 330/132 |
| 8,005,445 B2 * | 8/2011 | Kuriyama | ............ | H03G 3/3047 330/124 R |
| 8,022,768 B1 * | 9/2011 | Bowles | ................. | H03F 1/0288 330/295 |
| 2012/0223773 A1 * | 9/2012 | Jones | .................... | H03F 1/0227 330/124 R |

FOREIGN PATENT DOCUMENTS

| | | |
|---|---|---|
| CN | 102938657 A | 2/2013 |
| CN | 106559100 A | 4/2017 |
| CN | 207200889 U | 4/2018 |
| CN | 114024512 A | 2/2022 |

* cited by examiner

*Primary Examiner* — Henry Choe
(74) *Attorney, Agent, or Firm* — Stuart H. Mayer

(57) ABSTRACT

Disclosed is a dual-band coupling low-noise amplifying circuit and an amplifier, which comprises an input frequency dividing circuit, a high-frequency amplifying circuit, a low-frequency amplifying circuit and an output combining circuit. The input frequency dividing circuit includes a first duplexer, a first capacitor and a second capacitor, and the output combining circuit includes a second duplexer, a third capacitor and a fourth capacitor. The input frequency dividing circuit divides the received radio frequency signals into high-frequency signals and low-frequency signals, then inputs the high-frequency signals into the high-frequency amplifying circuit for power amplification, and inputs the low-frequency signals into the low-frequency amplifying circuit for power amplification, and outputs the high-frequency signals and the low-frequency signals after power amplification through the output combining circuit.

10 Claims, 5 Drawing Sheets

US 11,742,807 B1

DUAL-BAND COUPLING LOW-NOISE AMPLIFYING CIRCUIT AND AMPLIFIER

CROSS-REFERENCE TO RELATED APPLICATIONS

This application claims priority to Chinese Patent Application No. 202210486517.0, filed on May 6, 2022, the contents of which are hereby incorporated by reference.

TECHNICAL FIELD

The application relates to the technical field of wireless communication, and in particular to a dual-band coupling low-noise amplifying circuit and an amplifier.

BACKGROUND

With the continuous development of the $5^{th}$ generation mobile communication network, millimeter wave bands have the advantages of wider spectrum resources and faster transmission speeds, which will make millimeter waves more widely used in the communication field. As the key front-end component of a radio frequency receiver, the performance of a low-noise amplifier will directly affect the sensitivity and linearity of the whole receiver, and further affect the performance of the whole communication system. Nowadays a wireless communication device often has to meet specific requirements or different communication standards, which leads to increasingly more amplifies in communication terminal devices, and the conventional single-band amplify may hardly meet the requirements. Therefore, the dual-band amplifier structure, which contributes to smaller chip area and lower loss, and is compatible with increasingly complex working environments, will become a research hotspot in the communication industry.

FIG. 1 is a schematic diagram of a dual-band amplifier in the prior art. The dual-band amplification function is realized by using band-selected switches in the input and output networks of the amplifying circuit. However, the disadvantage of the circuit will generate extra higher power consumption, which will lead to large noise. Moreover, the input and output band-selected switches need extra power supplies, which will increase the cost and complexity. If the input and output band-selected switches are not used, the dual-band amplifying circuit cannot be realized, resulting in decreased practicality.

SUMMARY

In view of the above problems, this application provides a dual-band coupling low-noise amplifying circuit and amplifier, so as to realize multi-band processing of signals without using band-selected switches and achieve lower noise.

The specific scheme is as follows:

A dual-band coupling low-noise amplifying circuit, including an input frequency dividing circuit, a high-frequency amplifying circuit, a low-frequency amplifying circuit and an output combining circuit;

the input frequency dividing circuit includes a first duplexer, a first capacitor and a second capacitor; the first capacitor is connected in parallel to a through port of the first duplexer; the second capacitor is connected in parallel to an isolation port of the first duplexer; an input end of the high-frequency amplifying circuit is connected with a coupling port of the first duplexer; an input end of the low-frequency amplifying circuit is connected with the through port of the first duplexer;

the output coupling circuit includes a second duplexer, a third capacitor and a fourth capacitor; the third capacitor is connected in parallel to an isolation port of the second duplexer; the fourth capacitor is connected in parallel to a through port of the second duplexer; an output end of the high-frequency amplifying circuit is connected with a coupling port of the second duplexer; an output end of the low-frequency amplifying circuit is connected with an input port of the second duplexer;

after the input frequency dividing circuit divides received radio frequency signals into high-frequency signals and low-frequency signals, the high-frequency signals are input into the high-frequency amplifying circuit for a power amplification, and the low-frequency signals are input into the low-frequency amplifying circuit for the power amplification, and the output combining circuit couples and outputs the high-frequency signals and the low-frequency signals after the power amplification.

Optionally, the high-frequency amplifying circuit includes a first amplifying sub-circuit, a second amplifying sub-circuit and a third amplifying sub-circuit, and the first amplifying sub-circuit, the second amplifying sub-circuit and the third amplifying sub-circuit are electrically connected in sequence.

Optionally, the first amplifying sub-circuit includes a first field-effect transistor, a fifth capacitor, a sixth capacitor, a first inductor, a second inductor and a third inductor;

one end of the fifth capacitor is electrically connected with the coupling port of the first duplexer, and the other end is connected with a gate of the first field-effect transistor;

one end of the first inductor is electrically connected with an intermediate node of the fifth capacitor and the first field-effect transistor, and the other end is connected with a bias voltage;

one end of the second inductor is connected with a source level of the first field-effect transistor, and the other end is grounded;

the third inductor and the sixth capacitor are electrically connected to a drain electrode of the first field-effect transistor after being connected in parallel, and the third inductor is also connected with a voltage supply.

Optionally, the second amplifying sub-circuit includes a second field-effect transistor, a seventh capacitor, a fourth inductor, a fifth inductor and a sixth inductor;

one end of the fourth inductor is electrically connected with the gate of the second field-effect transistor, and the other end is connected with the bias voltage;

one end of the fifth inductor is connected with a source level of the second field-effect transistor, and the other end is grounded;

the sixth inductor and the seventh capacitor are connected in parallel and then electrically connected to a drain electrode of the second field-effect transistor, and the sixth inductor is also connected with the voltage supply.

Optionally, the third amplifying sub-circuit includes a third field-effect transistor, an eighth capacitor, a ninth capacitor, a tenth capacitor, a seventh inductor, an eighth inductor, a ninth inductor and a first resistor;

one end of the seventh inductor is connected with a gate of the third field-effect transistor, and the other end is connected with the bias voltage;

one end of the first resistor is electrically connected with one end of the eighth capacitor; the other end of the first resistor is connected with one end of the eighth inductor; the other end of the eighth inductor is connected with the voltage supply; the other end of the eighth capacitor is electrically connected to an intermediate node between the seventh inductor and the third field-effect transistor;

one end of the ninth inductor is connected with a source level of the third field-effect transistor, and the other end is grounded;

the eighth inductor and the ninth capacitor are connected in parallel and then connected with a drain electrode of the third field-effect transistor; the ninth capacitor is electrically connected with the coupling port of the second duplexer; the tenth capacitor is electrically connected to an intermediate node between the ninth capacitor and the second duplexer.

Optionally, the low-frequency amplifying circuit includes a fourth amplifying sub-circuit and a fifth amplifying sub-circuit, and the fourth amplifying sub-circuit and the fifth amplifying sub-circuit are electrically connected.

Optionally, the fourth amplifying sub-circuit includes a fourth field-effect transistor, an eleventh capacitor, a twelfth capacitor, a tenth inductor, an eleventh inductor, a twelfth inductor and a thirteenth inductor;

one end of the eleventh capacitor is connected with the through port of the first duplexer, and the other end is connected with an intermediate node between the eleventh capacitor and the first duplexer; the eleventh capacitor is electrically connected to a gate of the fourth field-effect transistor;

one end of the tenth inductor is electrically connected to an intermediate node between the first duplexer and the eleventh capacitor, and the other end of the tenth inductor is grounded.

one end of the eleventh inductor is connected with an intermediate node between the eleventh capacitor and the fourth field-effect transistor, and the other end is connected with the bias voltage;

one end of the twelfth inductor is connected with a source level of the fourth field-effect transistor, and the other end is grounded;

the twelfth capacitor is electrically connected to a drain electrode of the fourth field-effect transistor;

one end of the thirteenth inductor is electrically connected to an intermediate node between the twelfth capacitor and the fourth field-effect transistor; the other end of the thirteenth inductor is connected with the voltage supply.

Optionally, the fifth amplifying sub-circuit includes a fifth field-effect transistor, a thirteenth capacitor, a fourteenth capacitor, a fourteenth inductor, a fifteenth inductor, a sixteenth inductor and a second resistor;

one end of the fourteenth inductor is connected with a gate of the fifth field-effect transistor, and the other end is connected with the bias voltage;

one end of the fifteenth inductor is connected with a source level of the fifth field-effect transistor, and the other end is grounded;

the second resistor and the thirteenth capacitor form a parallel terminal; one end of the parallel terminal is electrically connected to a drain electrode of the fifth field-effect transistor, and the other end is electrically connected to an output port of the second duplexer after being connected in series with the fourteenth capacitor;

one end of the sixteenth inductor is electrically connected to an intermediate node between the parallel terminal and the fifth field-effect transistor, and the other end is connected to the voltage supply.

Optionally, the first capacitor, the second capacitor, the third capacitor and the fourth capacitor are respectively grounded.

A dual-band coupling low-noise amplifier includes the circuit as described above.

With the above technical scheme, the dual-band coupling low-noise amplifying circuit and amplifier of this application include an input frequency dividing circuit, a high-frequency amplifying circuit, a low-frequency amplifying circuit and an output combining circuit. After the input frequency dividing circuit divides the received radio frequency signals into high-frequency signals and low-frequency signals, the high-frequency signals are input to the high-frequency amplifying circuit for power amplification, and the low-frequency signals are input to the low-frequency amplifying circuit for power amplification, and the output combining circuit couples and outputs the high-frequency signal and the low-frequency signal after power amplification. Compared with the prior art, this application may avoid the high loss caused by the band-selected switch, thus avoiding generation of excessive noise, and making it possible to realize the multi-band low-loss and low-noise processing of signals without using the band-selected switch, and improving the practicability.

BRIEF DESCRIPTION OF THE DRAWINGS

Various advantages and benefits will become clear to those of ordinary skill in the art by reading the following detailed description of preferred embodiments. The drawings are only for the objective of illustrating the preferred embodiments, and are not to be considered as limitations of the application. Throughout the drawings, the same reference symbols are used to denote the same parts. In the attached drawings.

DETAILED DESCRIPTION OF THE EMBODIMENTS

The technical solutions in the embodiments of this application will be clearly and completely described below with reference to the drawings in the embodiments of this application. Obviously, the described embodiments are only part of the embodiments of this application, but not all of them. Based on the embodiments in this application, all other embodiments obtained by ordinary technicians in this field without creative labor belong to the scope of protection in this application.

The existing dual-band amplifier is generally controlled by field-effect transistor adjusting feedback switch, and the dual-band amplification function is realized by using band-selected switches in the input and output networks of the amplifying circuit. However, the disadvantage of the circuit will generate extra higher power consumption, which will lead to large noise. Moreover, the input and output band-selected switches need extra power supplies, which will increase the cost and complexity. If the input and output band-selected switches are not used, the dual-band amplifying circuit cannot be realized, resulting in decreased practicality.

Therefore, in order to solve the above problems, this application provides a dual-band coupling low-noise amplifying circuit, which may realize multi-band processing of signals without using band-selected switches, and at the same time generate less noise.

Figure 1:
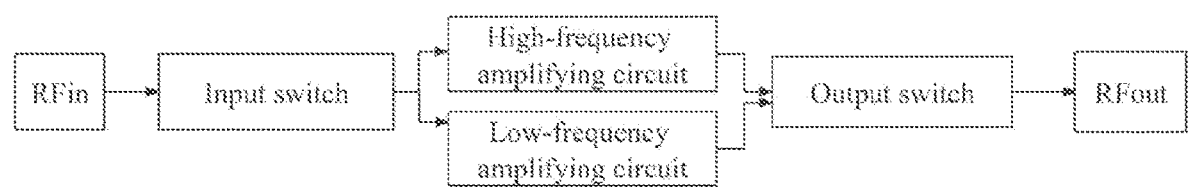
FIG. 1 is a schematic diagram of a dual-band amplifier in the prior art.
Figure 2:
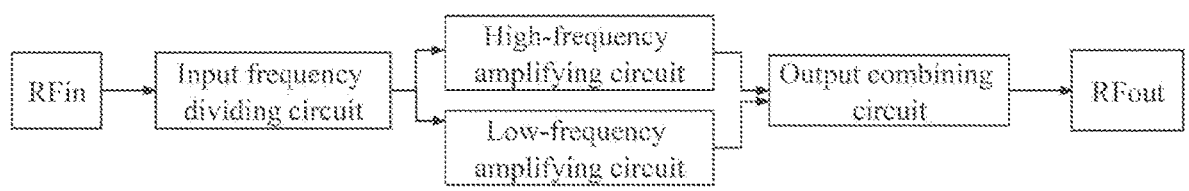
FIG. 2 is a schematic diagram of a dual-band coupling low-noise amplifying circuit according to the embodiment of the present application.

Next, a dual-band coupling low-noise amplifying circuit in this application is introduced in detail. FIG. 2 is a schematic diagram of a dual-band coupling low-noise amplifying circuit provided in the embodiment of this application, including an input frequency dividing circuit, a high-frequency amplifying circuit, a low-frequency amplifying circuit and an output combining circuit.

The input end of the input frequency dividing circuit is used to receive the input radio frequency signals RFin, and the output end of the output combining circuit is used to output the processed output radio frequency signal RFout.

The input frequency dividing circuit includes a first duplexer DUPLEX1, a first capacitor C1 and a second capacitor C2; the first capacitor C1 is connected in parallel to the through port of the first duplexer DUPLEX1; the second capacitor C2 is connected in parallel to the isolation port of the first duplexer DUPLEX1; the input end of the high-frequency amplifying circuit is connected with the coupling port of the first duplexer DUPLEX1; the input end of the low-frequency amplifying circuit is connected with the through port of the first duplexer DUPLEX1.

The output combining circuit includes a second duplexer DUPLEX2, a third capacitor C3 and a fourth capacitor C4; the third capacitor C3 is connected in parallel to the isolation port of the second duplexer DUPLEX2; the fourth capacitor C4 is connected in parallel to the through port of the second duplexer DUPLEX2; the output end of the high-frequency amplifying circuit is connected with the coupling port of the second duplexer DUPLEX2; the output end of the low-frequency amplifying circuit is connected with the input port of the second duplexer DUPLEX2.

After the input frequency dividing circuit divides the received radio frequency signals into high-frequency signals and low-frequency signals, the high-frequency signal is input into the high-frequency amplifying circuit for power amplification, and the low-frequency signal is input into the low-frequency amplifying circuit for power amplification, and the output combining circuit couples and outputs them the high-frequency signal and the low-frequency signal after power amplification.

It should be noted that, for general radio frequency signals, the low-frequency means the signal frequency of 30-300 kHz, and the high-frequency means the signal frequency of 3-30 MHz. However, the concepts of "high-frequency" and "low-frequency" in the embodiment of this application are only used to distinguish radio frequency signals with different frequencies, and there is no specific rule for frequency division. Similarly, in some other embodiments, it may also be applied to multi-frequency RF signal amplification, not only limited to high-frequency and low-frequency.

It can be known from the above technical scheme that the dual-band coupling low-noise amplifying circuit and an amplifier of the embodiment of the present application includes an input frequency dividing circuit, a high-frequency amplifying circuit, a low-frequency amplifying circuit and an output combining circuit. The input frequency dividing circuit may divide the received radio frequency signals into high-frequency signals and low-frequency signals, and then input the high-frequency signal into the high-frequency amplifying circuit for power amplification, and then input the low-frequency signal into the low-frequency amplifying circuit for power amplification, and the output combining circuit couples and outputs the high-frequency signal and the low-frequency signal after power amplification. Compared with the prior art, the input frequency dividing circuit and the output combining circuit may avoid the high loss caused by the band-selected switch, thus avoiding the excessive noise, which may realize the multi-band low-loss and low-noise processing of signals without using the band-selected switches, and the practicability is improved. Meanwhile, there is no need to add an additional power supply in the circuit, which may reduce the cost and complexity of the circuit.

Specifically, the first duplexer DUPLEX1 and the second duplexer DUPLEX2 are respectively coupled by transmission lines, which may be microstrip lines.

The first capacitor C1 and the second capacitor C2 are parallel grounding capacitors of the first duplexer DUPLEX1, which are used to compensate the phase difference between the high-frequency signal and the low-frequency signal and improve the coupling power.

The third capacitor C3 and the fourth capacitor C4 are parallel grounding capacitors of the second duplexer DUPLEX2, which are used to compensate the phase difference between the high-frequency signal and the low-frequency signal and improve the coupling power.

Figure 3:
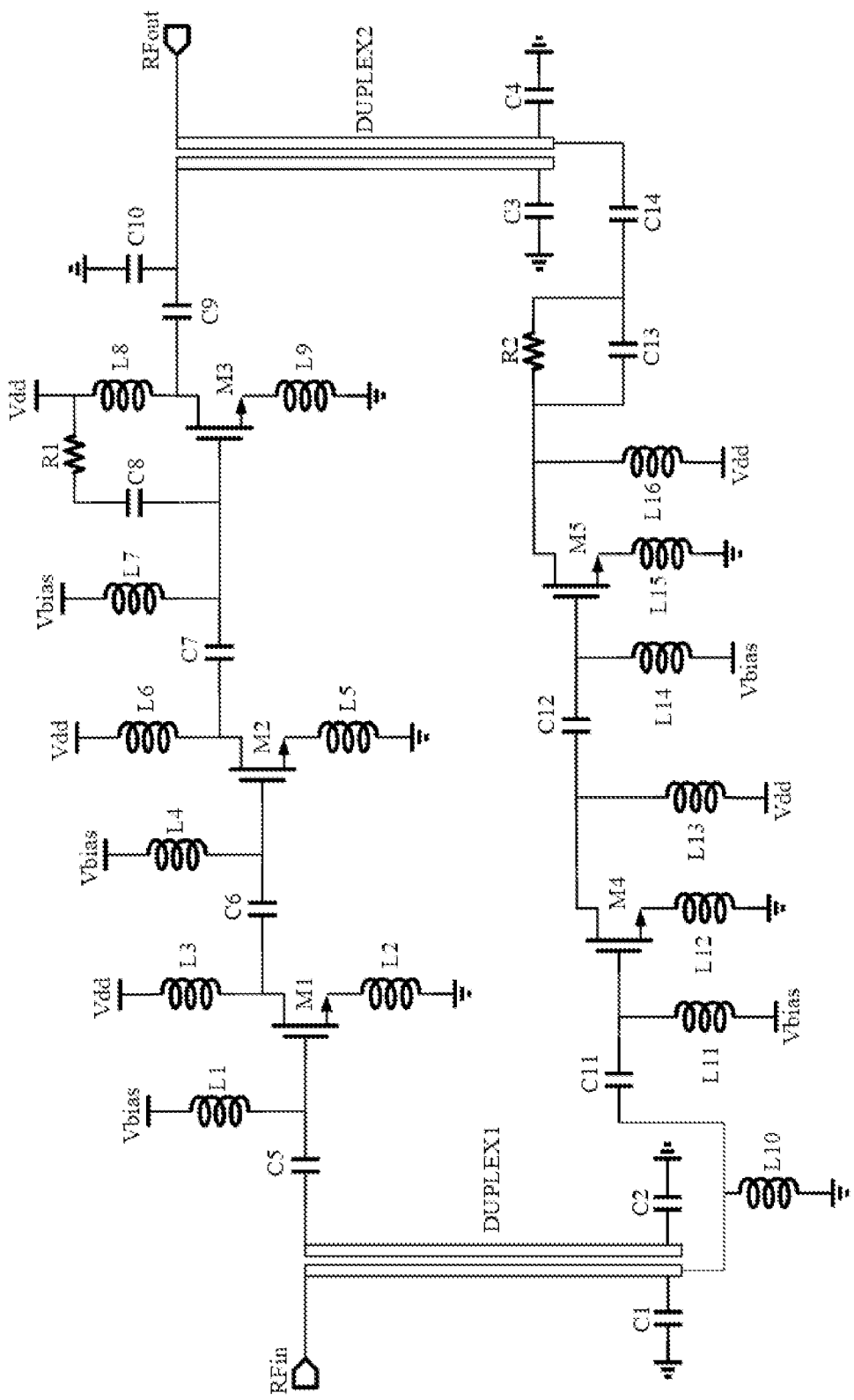
FIG. 3 is a schematic structural diagram of a dual-band coupling low-noise amplifying circuit according to an embodiment of the present application.

Next, the high-frequency amplifying circuit is introduced in detail. As shown in FIG. 3, the high-frequency amplifying circuit includes a first amplifying sub-circuit, a second amplifying sub-circuit and a third amplifying sub-circuit, which are electrically connected in sequence.

Specifically, the first amplifying sub-circuit, the second amplifying sub-circuit and the third amplifying sub-circuit are respectively a high-frequency first-stage amplifying circuit, a high-frequency second-stage amplifying circuit and a high-frequency third-stage amplifying circuit. Because the circuit has skin effect under the condition of radio frequency, unlike the direct current, the current flows in the whole conductor under the condition of the direct current, while the current flows on the surface of the conductor under the condition of high-frequency. As a result, the alternating current resistance at high-frequency is greater than the direct current resistance. In addition, there is an electromagnetic radiation effect in high-frequency circuits, that is, with the increase of frequency, when the wavelength is comparable to the circuit size, the circuit will become a radiator. At this time, various coupling effects will occur between circuits, between circuits and the external environment, which leads to many interference problems, so three-stage amplification is needed to overcome these problems. In some other embodiments, the high-frequency amplifying circuit may also include a high-frequency first-stage amplifying circuit or a high-frequency multi-stage amplifying circuit.

The first amplifier sub-circuit includes a first field-effect transistor M1, a fifth capacitor C5, a sixth capacitor C6, a first inductor L1, a second inductor L2 and a third inductor L3.

One end of the fifth capacitor C5 is electrically connected to the coupling port of the first duplexer DUPLEX1, and the other end is connected to the gate of the first field-effect transistor M1.

One end of the first inductor L1 is electrically connected to the intermediate node of the fifth capacitor C5 and the first field-effect transistor M1, and the other end is connected to the bias voltage Vbias.

One end of the second inductor L2 is connected to the source level of field-effect transistor M1, and the other end is grounded.

Specifically, the first amplifying sub-circuit adopts a common-source structure, and the second inductor L2 is the source level degeneration inductor of the first field-effect transistor M1, which may improve the working linearity.

The third inductor L3 and the sixth capacitor C6 are connected in parallel and then electrically connected to the drain electrode of the first field-effect transistor M1, and the third inductor L3 is also connected to the voltage supply Vdd.

The second amplifier sub-circuit includes a second field-effect transistor M2, a seventh capacitor C7, a fourth inductor L4, a fifth inductor L5 and a sixth inductor L6.

One end of the fourth inductor L4 is electrically connected to the gate of the second field-effect transistor M2, and the other end is connected to the bias voltage Vbias.

One end of the fifth inductor L5 is connected to the source of the second field-effect transistor M2, and the other end is grounded.

Specifically, the second amplifying sub-circuit adopts a common-source structure, and the fifth inductor L5 is the source level degeneration inductor of the second field-effect transistor M2, which may improve the working linearity.

The sixth inductor L6 and the seventh capacitor C7 are connected in parallel and then electrically connected to the drain electrode of the second field-effect transistor M2, and the sixth inductor L6 is also connected to the voltage supply Vdd.

The third amplifier sub-circuit includes a third field-effect transistor M3, an eighth capacitor C8, a ninth capacitor C9, a tenth capacitor C10, a seventh inductor L7, an eighth inductor L8, a ninth inductor L9 and a first resistor R1.

One end of the seventh inductor L7 is connected to the gate of the third field-effect transistor M3, and the other end is connected to the bias voltage Vbias.

One end of the first resistor R1 is electrically connected to one end of the eighth capacitor C8, the other end of the first resistor R1 is connected to one end of the eighth inductor L8, the other end of the eighth inductor L8 is connected to the voltage supply Vdd, and the other end of the eighth capacitor C8 is electrically connected to the intermediate node between the seventh inductor L7 and the third field-effect transistor M3.

Specifically, the first resistor R1 and the eighth capacitor C8 form an RC negative feedback structure, and the gain flattening and stability improvement are realized through a feedback loop.

One end of the ninth inductor L9 is connected to the source level of the third field-effect transistor M3, and the other end is grounded.

Specifically, the ninth inductor L9 is the source level degeneration inductor of the third field-effect transistor M3, which may improve the working linearity.

The eighth inductor L8 and the ninth capacitor C9 are connected in parallel to the drain electrode of the third field-effect transistor M3, the ninth capacitor C9 is electrically connected to the coupling port of the second duplexer DUPLEX2, and the tenth capacitor C10 is electrically connected to the intermediate node between the ninth capacitor C9 and the second duplexer DUPLEX2.

Specifically, the connection mode among the first amplifying sub-circuit, the second amplifying sub-circuit and the third amplifying sub-circuit is as follows: one end of the sixth capacitor C6 is electrically connected with the gate of the second field-effect transistor M2; one end of the seventh capacitor C7 is electrically connected to the gate of the third field-effect transistor M3.

Understandably, there are many ways to amplify the power of radio frequency signals, and correspondingly, there are also many forms of high-frequency signal amplifying circuits. The embodiment of this application is only one of the ways to achieve the technical effect. In some other embodiments, the forms of high-frequency signal amplifying circuits may also be other ways of implementation, which should not be regarded as a limitation on the specific forms of circuits.

Next, the low-frequency amplifying circuit is introduced in detail. As shown in FIG. 3, the low-frequency amplifying circuit includes a fourth amplifying sub-circuit and a fifth amplifying sub-circuit, and the fourth amplifying sub-circuit and the fifth amplifying sub-circuit are electrically connected.

Specifically, the fourth amplifying sub-circuit and the fifth amplifying sub-circuit are respectively the low-frequency first-stage amplifying circuit and the low-frequency second-stage amplifying circuit of the low-frequency amplifying circuit. In some other embodiments, the low-frequency amplifying circuit may be a low-frequency first-stage amplifying circuit or a low-frequency multi-stage amplifying circuit.

The fourth amplifying sub-circuit includes a fourth field-effect transistor M4, an eleventh capacitor C11, a twelfth capacitor C12, a tenth inductor L10, an eleventh inductor L11, a twelfth inductor L12 and a thirteenth inductor L13.

One end of the eleventh capacitor C11 is connected to the through port of the first duplexer DUPLEX1, and the other end is connected to the intermediate node between the eleventh capacitor C11 and the first duplexer DUPLEX1. The eleventh capacitor C11 is also electrically connected to the gate of the fourth field-effect transistor M4.

One end of the tenth inductor L10 is electrically connected to the intermediate node between the first duplexer DUPLEX1 and the eleventh capacitor C11, and the other end of the tenth inductor L10 is grounded.

One end of the eleventh inductor L11 is connected to the intermediate node between the eleventh capacitor C11 and the fourth field-effect transistor M4, and the other end is connected to the bias voltage Vbias.

One end of the twelfth inductor L12 is connected to the source level of the fourth field-effect transistor M4, and the other end is grounded.

Specifically, the low-frequency first-stage amplifying circuit adopts a common-source structure, and the twelfth inductor L12 is the source level degeneration inductor of the fourth field-effect transistor M4, which may improve the working linearity.

The twelfth capacitor C12 is electrically connected to the drain electrode of the fourth field-effect transistor M4.

One end of the thirteenth inductor L13 is electrically connected to the intermediate node between the twelfth capacitor C12 and the fourth field-effect transistor M4, and the other end of the thirteenth inductor L13 is also connected to the voltage supply Vdd.

The fifth amplifying sub-circuit includes a fifth field-effect transistor M5, a thirteenth capacitor C13, a fourteenth capacitor C14, a fourteenth inductor L14, a fifteenth inductor L15, a sixteenth inductor L16 and a second resistor R2.

One end of the fourteenth inductor L14 is connected to the gate of the fifth field-effect transistor M5, and the other end is connected to the bias voltage Vbias.

One end of the fifteenth inductor L15 is connected to the source of the fifth field-effect transistor M5, and the other end is grounded.

Specifically, the fifteenth inductor L15 is the source level degeneration inductor of the fifth field-effect transistor M5, which may improve the working linearity.

The second resistor R2 and the thirteenth capacitor C13 form a parallel terminal, one end of which is electrically connected to the drain electrode of the fifth field-effect transistor M5, and the other end of which is electrically connected to the output port of the second duplexer DUPLEX2 after being connected in series with the fourteenth capacitor C14.

Specifically, the second resistor R2 and the thirteenth capacitor C13 form an LC parallel network, which may enhance the stability of the circuit.

One end of the sixteenth inductor L16 is electrically connected to the intermediate node between the parallel terminal and the fifth field-effect transistor M5, and the other end is connected to the voltage supply Vdd.

Specifically, the connection relationship between the fourth amplifying sub-circuit and the fifth amplifying sub-circuit is that one end of the twelfth capacitor C12 is electrically connected to the gate of the fifth field-effect transistor M5.

Understandably, there are many ways to amplify the power of radio frequency signals, and correspondingly, there are also many forms of low-frequency signal amplifying circuits. The embodiment of this application is only one of the ways to achieve the technical effect. In some other embodiments, the forms of low-frequency signal amplifying circuits may also be other ways of implementation, which should not be regarded as a limitation on the specific forms of circuits.

Figure 4:
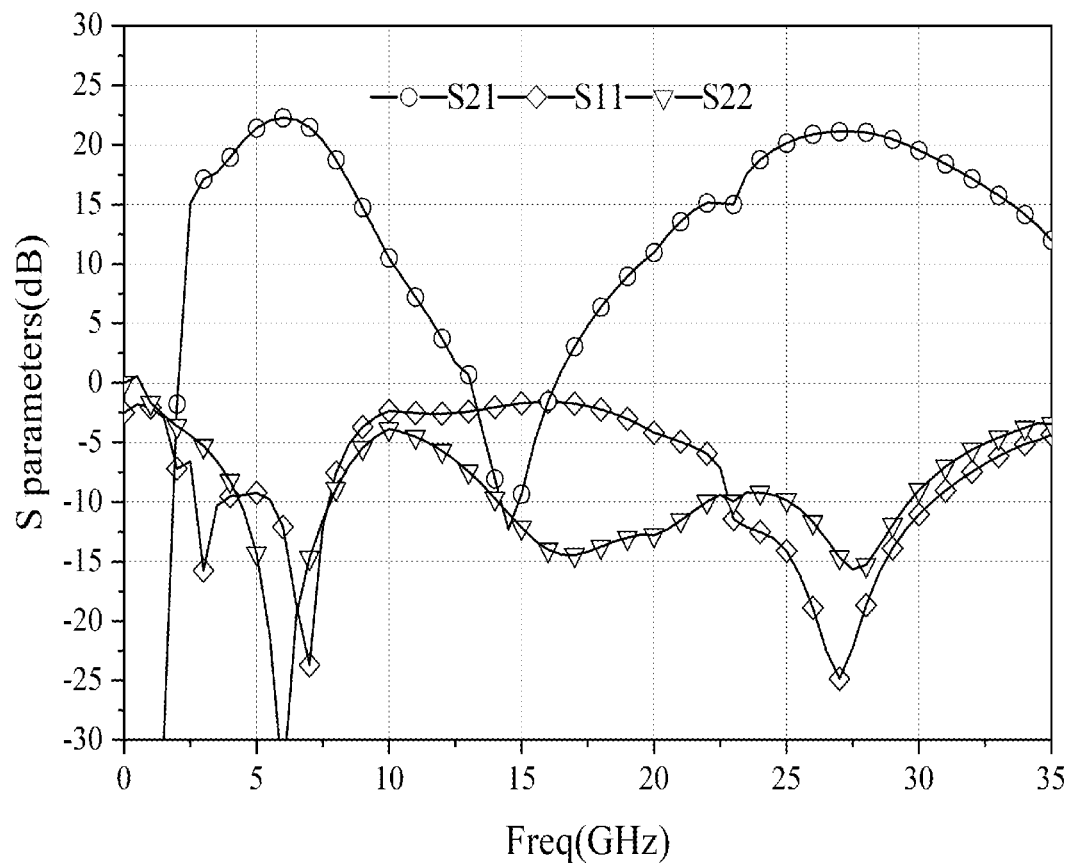
FIGS. 4-5 show the simulation results of electrical performance of a dual-band coupling low-noise amplifying circuit according to the embodiment of the present application.
Figure 5:
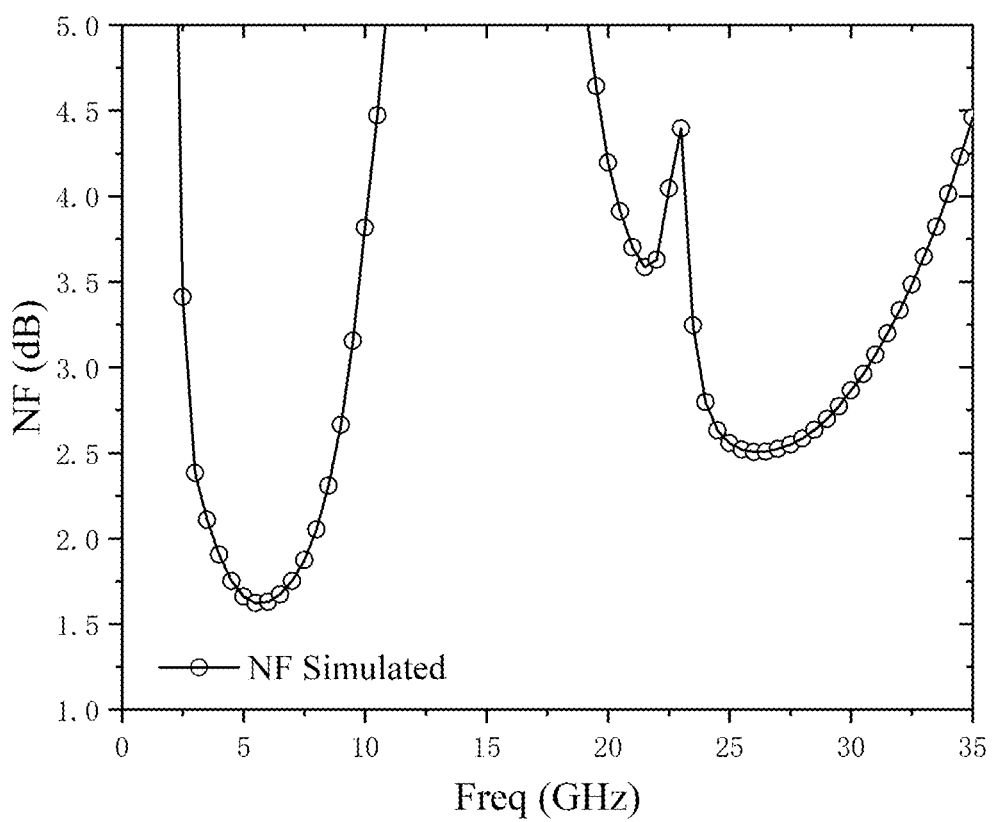

FIGS. 4-5 show the simulation results of electrical performance of a dual-band coupling low-noise amplifying circuit of the embodiment of the present application. As shown in FIG. 4, the dual-band coupling low-noise amplifying circuit of the embodiment of the present application may achieve a similar effect in performance compared with the single-band low-noise amplifying circuit. As shown in FIG. 5, in the frequency band of 4.5-7 GHz, the noise figure is lower than 1.75 dB; in the frequency band of 24-30 GHz, the noise figure is lower than 2.85 dB.

The embodiment of the application also provides a dual-band coupling low-noise amplifier, which includes the dual-band coupling low-noise amplifying circuit as described above.

Understandably, the dual-band coupled low-noise amplifier provided by the embodiment of the present application has the following advantages.

1. The amplifier of the embodiment of this application adopts the coupled transmission line, which may divide and then couple the input signals. The amplifying circuits of two different frequency bands only need to be matched in the corresponding single frequency band, and the circuit architecture of this amplifier may be suitable for other different working frequency bands by optimizing the matching of coupling lines and improving the amplifier structure.

2. The switching of the two working frequency bands of the amplifier in the embodiment of the present application does not need a switch, and the dual-band operation of low-noise amplifier (low-noise amplifier) may be controlled by turning off the drain voltage of unused single-band transistors, that is, the circuit may work in single-band or dual-band at the same time.

3. The amplifier of the embodiment of this application improves the noise performance of the amplifier by optimizing the multi-band amplifier architecture, so that the performance of the dual-band low-noise amplifier may be compared with that of the single-band low-noise amplifier in the corresponding frequency band.

Finally, it should be noted that in this application, relational terms such as first and second are only used to distinguish one entity or operation from another entity or operation, and do not necessarily require or imply any such actual relationship or sequence between these entities or operations. Moreover, the term "including", "including" or any other variation thereof is intended to cover non-exclusive inclusion, so that a process, method, article or equipment that includes a series of elements not only includes those elements, but also includes other elements not explicitly listed, or also includes elements inherent to such process, method, article or equipment. Without further restrictions, the element defined by the statement "including one . . . " does not exclude the existence of another identical element in the process, method, article or equipment that includes the element.

In this specification, each embodiment is described in a progressive way, and each embodiment focuses on the differences from other embodiments. Each embodiment may be combined according to needs, and the same and similar parts may be referred to each other.

The above description of the disclosed embodiments enables those skilled in the art to make or use this application. Many modifications to these embodiments will be obvious to those skilled in the art, and the general principles defined herein may be implemented in other embodiments without departing from the spirit or scope of this application. Therefore, this application will not be limited to the embodiments shown herein, and the scope of protection of the application shall be defined by the claims of the application.

What is claimed is:

1. A dual-band coupling low-noise amplifying circuit, comprising an input frequency dividing circuit, a high-frequency amplifying circuit, a low-frequency amplifying circuit and an output combining circuit;

wherein the input frequency dividing circuit comprises a first duplexer, a first capacitor and a second capacitor; the first capacitor is connected in parallel to a through port of the first duplexer; the second capacitor is connected in parallel to an isolation port of the first duplexer; an input end of the high-frequency amplifying circuit is connected with a coupling port of the first duplexer; an input end of the low-frequency amplifying circuit is connected with the through port of the first duplexer; the first capacitor and the second capacitor are grounded in parallel;

the output combining circuit comprises a second duplexer, a third capacitor and a fourth capacitor; the third capacitor is connected in parallel to an isolation port of the second duplexer; the fourth capacitor is connected in parallel to a through port of the second duplexer; an output end of the high-frequency amplifying circuit is connected with a coupling port of the second duplexer; an output end of the low-frequency amplifying circuit is connected with an input port of the second duplexer; the third capacitor and the fourth capacitor are connected to ground in parallel; and after the input frequency dividing circuit divides received radio frequency signals into high-frequency signals and low-frequency signals, the high-frequency signals are input into the high-frequency amplifying circuit for a power amplification, and the low-frequency signals are input into the low-frequency amplifying circuit for the power amplification, and the output combining circuit couples and outputs the high-frequency signals and the low-frequency signals after the power amplification.

2. The circuit according to claim 1, wherein the high-frequency amplifying circuit comprises a first amplifying sub-circuit, a second amplifying sub-circuit and a third amplifying sub-circuit, and the first amplifying sub-circuit, the second amplifying sub-circuit and the third amplifying sub-circuit are electrically connected in sequence.

3. The circuit according to claim 2, wherein the first amplifying sub-circuit comprises a first field-effect transistor, a fifth capacitor, a sixth capacitor, a first inductor, a second inductor and a third inductor;
one end of the fifth capacitor is electrically connected with the coupling port of the first duplexer, and the other end is connected with a gate of the first field-effect transistor;
one end of the first inductor is electrically connected with an intermediate node of the fifth capacitor and the first field-effect transistor, and the other end is connected with a bias voltage;
one end of the second inductor is connected with a source level of the first field-effect transistor, and the other end is grounded; and
the third inductor and the sixth capacitor are electrically connected to a drain electrode of the first field-effect transistor after being connected in parallel, and the third inductor is also connected with a voltage supply.

4. The circuit according to claim 2, wherein the second amplifying sub-circuit comprises a second field-effect transistor, a seventh capacitor, a fourth inductor, a fifth inductor and a sixth inductor;
one end of the fourth inductor is electrically connected with a gate of the second field-effect transistor, and the other end is connected with the bias voltage;
one end of the fifth inductor is connected with a source level of the second field-effect transistor, and the other end is grounded; and
the sixth inductor and the seventh capacitor are connected in parallel and then electrically connected to a drain electrode of the second field-effect transistor, and the sixth inductor is also connected with the voltage supply.

5. The circuit according to claim 2, wherein the third amplifying sub-circuit comprises a third field-effect transistor, an eighth capacitor, a ninth capacitor, a tenth capacitor, a seventh inductor, an eighth inductor, a ninth inductor and a first resistor;
one end of the seventh inductor is connected with a gate of the third field-effect transistor, and the other end is connected with the bias voltage;
one end of the first resistor is electrically connected with one end of the eighth capacitor; the other end of the first resistor is connected with one end of the eighth inductor; the other end of the eighth inductor is connected with the voltage supply; the other end of the eighth capacitor is electrically connected to an intermediate node between the seventh inductor and the third field-effect transistor;
one end of the ninth inductor is connected with a source level of the third field-effect transistor, and the other end of the ninth inductor is grounded; and
the eighth inductor and the ninth capacitor are connected in parallel and then connected with a drain electrode of the third field-effect transistor; the ninth capacitor is electrically connected with the coupling port of the second duplexer; and the tenth capacitor is electrically connected to an intermediate node between the ninth capacitor and the second duplexer.

6. The circuit according to claim 1, wherein the low-frequency amplifying circuit comprises a fourth amplifying sub-circuit and a fifth amplifying sub-circuit, and the fourth amplifying sub-circuit and the fifth amplifying sub-circuit are electrically connected.

7. The circuit according to claim 6, wherein the fourth amplifying sub-circuit comprises a fourth field-effect transistor, an eleventh capacitor, a twelfth capacitor, a tenth inductor, an eleventh inductor, a twelfth inductor and a thirteenth inductor;
one end of the eleventh capacitor is connected with the through port of the first duplexer, and the other end is connected with an intermediate node between the eleventh capacitor and the first duplexer; and the eleventh capacitor is electrically connected to a gate of the fourth field-effect transistor;
one end of the tenth inductor is electrically connected to an intermediate node between the first duplexer and the eleventh capacitor, and the other end of the tenth inductor is grounded;
one end of the eleventh inductor is connected with an intermediate node between the eleventh capacitor and the fourth field-effect transistor, and the other end is connected with the bias voltage;
one end of the twelfth inductor is connected with a source level of the fourth field-effect transistor, and the other end is grounded;
the twelfth capacitor is electrically connected to a drain electrode of the fourth field-effect transistor; and
one end of the thirteenth inductor is electrically connected to an intermediate node between the twelfth capacitor and the fourth field-effect transistor; and the other end of the thirteenth inductor is connected with the voltage supply.

8. The circuit according to claim 6, wherein the fifth amplifying sub-circuit comprises a fifth field-effect transistor, a thirteenth capacitor, a fourteenth capacitor, a fourteenth inductor, a fifteenth inductor, a sixteenth inductor and a second resistor;
one end of the fourteenth inductor is connected with a gate of the fifth field-effect transistor, and the other end is connected with the bias voltage;
one end of the fifteenth inductor is connected with a source level of the fifth field-effect transistor, and the other end is grounded;
the second resistor and the thirteenth capacitor form a parallel terminal; one end of the parallel terminal is electrically connected to a drain electrode of the fifth field-effect transistor, and the other end is electrically connected to an output port of the second duplexer after being connected in series with the fourteenth capacitor; and
one end of the sixteenth inductor is electrically connected to an intermediate node between the parallel terminal and the fifth field-effect transistor, and the other end is connected to the voltage supply.

9. The circuit according to claim 1, wherein the first capacitor, the second capacitor, the third capacitor and the fourth capacitor are respectively grounded at one end.

10. A dual-band coupling low-noise amplifier, wherein the amplifier comprises the circuit as claimed in claim 1.

* * * * *